US012688021B2

(12) United States Patent
Dorairaj

(10) Patent No.: US 12,688,021 B2
(45) Date of Patent: Jul. 21, 2026

(54) PROCESSOR CONTROLLED PROGRAMMABLE LOGIC DEVICE MODIFICATION

(71) Applicant: Altera Corporation, San Jose, CA (US)

(72) Inventor: Nij Dorairaj, Campbell, CA (US)

(73) Assignee: Altera Corporation, San Jose, CA (US)

( * ) Notice: Subject to any disclaimer, the term of this patent is extended or adjusted under 35 U.S.C. 154(b) by 174 days.

(21) Appl. No.: 16/726,128

(22) Filed: Dec. 23, 2019

(65) Prior Publication Data

US 2020/0133649 A1 Apr. 30, 2020

(51) Int. Cl.
| | |
|---|---|
| *G06F 8/41* | (2018.01) |
| *G06F 8/72* | (2018.01) |
| *G06F 9/38* | (2018.01) |
| *G06F 9/54* | (2006.01) |
| *G06F 30/331* | (2020.01) |

(52) U.S. Cl.
CPC ............ *G06F 8/447* (2013.01); *G06F 8/4434* (2013.01); *G06F 8/72* (2013.01); *G06F 9/3877* (2013.01); *G06F 9/541* (2013.01); *G06F 30/331* (2020.01)

(58) Field of Classification Search
CPC .......... G06F 8/447; G06F 8/4434; G06F 8/73; G06F 30/331; G06F 9/3877; G06F 9/541
USPC ....................................................... 717/151
See application file for complete search history.

(56) References Cited

U.S. PATENT DOCUMENTS

| | | | | |
|---|---|---|---|---|
| 11,204,747 | B1 * | 12/2021 | Zejda ........................ | G06N 3/02 |
| 2006/0095722 | A1 * | 5/2006 | Biles ..................... | G06F 8/4441 |
| | | | | 712/34 |
| 2015/0178210 | A1 * | 6/2015 | Beers ................... | G06F 12/0806 |
| | | | | 711/146 |
| 2016/0182398 | A1 * | 6/2016 | Davis .................. | G06F 13/4031 |
| | | | | 710/313 |
| 2016/0239445 | A1 * | 8/2016 | Davis .................... | G06F 13/364 |
| 2017/0024352 | A1 * | 1/2017 | Lavasani ............... | G06F 3/0613 |
| 2017/0103022 | A1 * | 4/2017 | Kreinin ................. | G06F 9/3824 |
| 2018/0081809 | A1 * | 3/2018 | Turner ................. | G06F 12/084 |
| 2018/0150330 | A1 * | 5/2018 | Bernat ............... | G06F 11/3006 |

(Continued)

OTHER PUBLICATIONS

"An Introduction to the Intel QuickPath Interconnect," Intel, Jan. 2009.

(Continued)

*Primary Examiner* — Bradford F Wheaton
(74) *Attorney, Agent, or Firm* — Fletcher Yoder, P.C.

(57) ABSTRACT

Systems or methods of the present disclosure may provide a computing system that includes a processor and one or more implemented designs in one or more configurable circuits of a programmable logic fabric. The computing system also includes a memory coupled to the programmable logic fabric. The computing system further includes an accelerator that is located in-line between the one or more configurable circuits and the memory. The accelerator is defined using a low-level programming language. The processor is coupled to the accelerator and is configured to enable modification of the definition of the accelerator by converting a high-level programming language to the low-level programming language to change the way that the accelerator operates.

19 Claims, 5 Drawing Sheets

(56)         References Cited

U.S. PATENT DOCUMENTS

2018/0349290 A1 *  12/2018  Staudenmaier ......... G06F 13/28
2019/0213050 A1 *   7/2019  Fredrickson ........ G06F 12/1045

OTHER PUBLICATIONS

"Intel Acceleration Stack for Intel Xeon® CPU with FPGAs Core
Cache Interface (CCI-P) Reference Manual." Intel, Nov. 4, 2019.
Mulnix, David, "Intel Xeon Processor Scalable Family Technical
Overview," Intel, Jul. 10, 2019, last accessed Dec. 23, 2019,
https://webcache.googleusercontent.com/search?q=
cache:v7f7uVeOyV4J:https://software.intel.com/en-us/articles/intel-
xeon-processor-scalable-family-technical-overview+&cd=2&hl=en
&ct=clnk&gl=US.
"Intel FPGA Acceleration Hub," Intel, last accessed Dec. 23, 2019,
https://www.intel.com/content/www/us/en/programmable/solutions/
acceleration-hub/acceleration-stack.html.

* cited by examiner

PROCESSOR CONTROLLED PROGRAMMABLE LOGIC DEVICE MODIFICATION

BACKGROUND

The present disclosure relates generally to integrated circuits, such as processors and/or programmable logic device(s) (e.g., field-programmable gate arrays (FPGAs)). More particularly, the present disclosure relates to electronic devices incorporating integrated processors and FPGAs.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Modern electronics, such as computers, portable devices, network routers, data centers, Internet-connected appliances, and more, tend to include at least one integrated circuit device. Integrated circuit devices may take on a variety of forms, including processors (e.g., central processing units (CPUs)), memory devices, and programmable devices (e.g., FPGA), to name only a few examples. The programmable devices, in particular, may include a programmable fabric of logic that may be programmed (e.g., configured) and reprogrammed (e.g., reconfigured) after manufacturing to provide a wide variety of functionality based on a circuit design.

Programmable logic devices are a class of integrated circuits that can be programmed to perform a wide variety of operations. A programmable logic device may include programmable logic elements programmed that may be programmed to perform custom operations or to implement a circuit design. To program custom operations and/or circuit design into a programmable logic device, the circuit design may be compiled into a bitstream and programmed into configuration memory in the programmable logic device. The values programmed using the bitstream define the operation of programmable logic elements of the programmable logic device. Certain functions programmed in a programmable logic device may be synchronous.

In some embodiments, programmable logic devices and processors may be integrated in a single package or device, where some operations may be executed by a programmable logic device and a processor cooperatively. For example, the package may include a system-on-chip (SoC) that include the processor and the programmable logic device. However, programming the programmable logic device utilizes low-level programming languages that include instructions to be implemented on the programmable logic device.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. The increase in the size and complexity of systems that may employ programmable logic devices may lead to increased complexity in design software and increased need for design flexibility of the programmable logic elements in the programmable logic device.

To implement circuit designs in a programmable logic fabric, different sectors, portions, or regions of a programmable logic device may perform different operations on data that may be exchanged between the regions. In order to process and exchange data, it may be useful to have synchronization in the timing of the operations taking place in the multiple sectors (e.g., regions).

Figure 1:
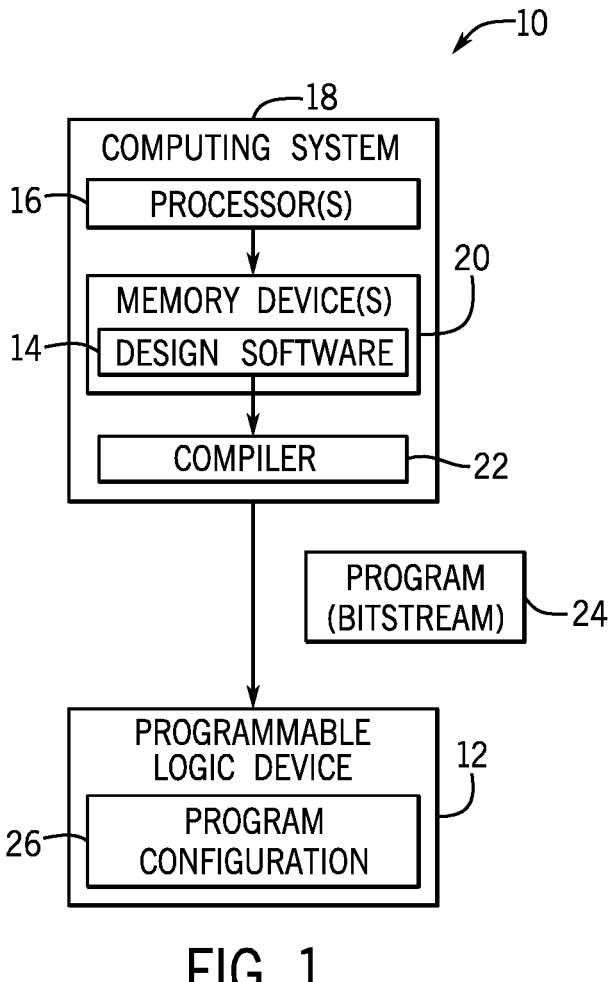
FIG. 1 is a computing system, in accordance with an embodiment of the present disclosure.

By way of introduction, FIG. 1 illustrates a block diagram of a system 10 that performs operations based at least in part on a design programmed in the programmable logic device 12, in accordance with an embodiment of the present disclosure. The programmable logic device 12 may be reconfigurable (e.g., a field programmable gate array (FPGA)). A user may implement a circuit design to be programmed onto the programmable logic device 12 using a design description 14. The programmable logic device 12 may include one or multiple fabrics or cores used to implement the circuit design(s). The programmable logic device 12 may also include other subsystems interconnected to the fabric(s) to establish a connection with other processing devices. The subsystems may include a pre-allocated, non-configurable section(s) of a programmable logic device 12 that may be interconnected internally to chip input/output pins, the other subsystems, and/or the programmable fabric including programmable logic regions 32.

The design description 14 may be designed or modified using design software that is executed by one or more processors 16 of a computing system 18. The computing system 18 may include any suitable device capable of executing the design description 14, such as a desktop computer, a laptop, a mobile electronic device, a server, and the like. The computing system 18 may access, configure, and/or communicate with the programmable logic device 12. The processor(s) 16 may include multiple microprocessors, one or more other integrated circuits (e.g., application specific integrated circuits, field programmable gate arrays, reduced instruction set processors, and the like), or some combination thereof.

One or more memory devices 20 may store the design description 14. In addition, the memory device(s) 20 may store information related to the programmable logic device 12, such as control software, configuration software, look up tables, configuration data, etc. In some embodiments, the processor(s) 16 and/or the memory device(s) 20 may be external to the computing system 18. Regardless of location of the memory device(s) 20, the memory device(s) 20 may each include a tangible, non-transitory, and machine-readable-medium, such as a volatile memory (e.g., a random access memory (RAM)) and/or a nonvolatile memory (e.g., a read-only memory (ROM)). The memory device(s) 20 may store a variety of information and be used for various purposes. For example, the memory device(s) 20 may store machine-readable and/or processor-executable instructions (e.g., firmware or software) for the processor(s) 16 to execute, such as instructions to determine a speed of the programmable logic device 12 or a region of the programmable logic device 12, determine a criticality of a path of a design programmed in the programmable logic device 12 or a region of the programmable logic device 12, programming the design in the programmable logic device 12 or a region of the programmable logic device 12, and the like. The memory device(s) 20 may include one or more storage devices (e.g., nonvolatile storage devices) that may include read-only memory (ROM), flash memory, a hard drive, or any other suitable optical, magnetic, or solid-state storage medium, or any combination thereof.

The design description 14 is used by a compiler 22 to generate a low-level circuit design in a program 24 (bit-stream), sometimes known as a program object file, which programs the programmable logic device 12. That is, the compiler 22 may provide machine-readable instructions representative of the circuit design to the programmable logic device 12. For example, the programmable logic device 12 may receive one or more programs 24 that describe the hardware implementations that should be stored in the programmable logic device 12. The programs 24 may programmed into the programmable logic device 12 as a configuration program 26. The configuration program 26 may be represented as "configuration data" that is routed to various regions of the programmable logic device, even when one or more of those regions are powered down.

Figure 2:
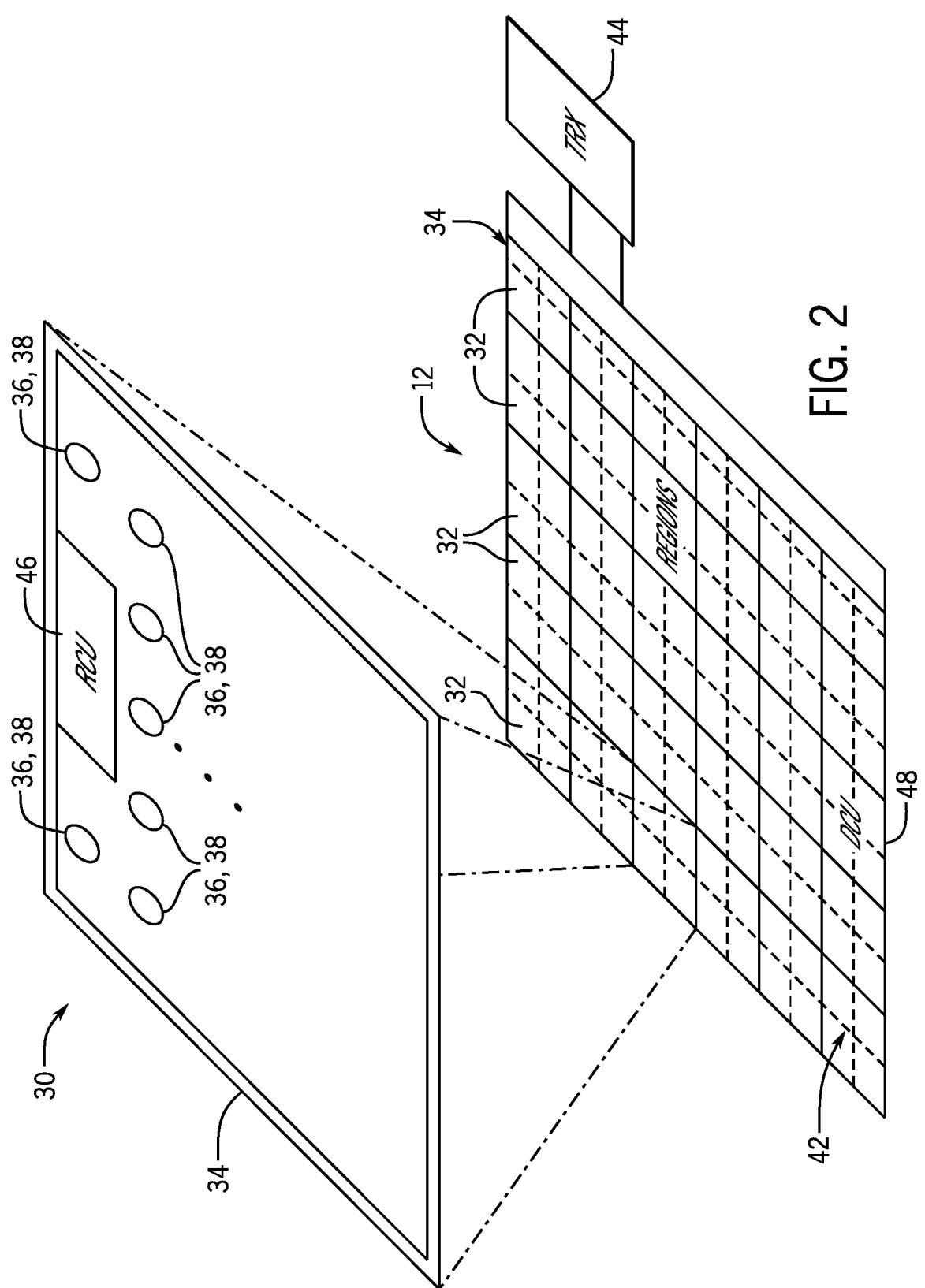
FIG. 2 is a programmable logic device, in accordance with an embodiment of the present disclosure.

FIG. 2 is a diagram of a system 30 that illustrates regions 32 of the programmable logic device 12 of FIG. 1, in accordance with an embodiment of the present disclosure. As illustrated, the programmable logic device 12 is a programmable circuit, such as a field programmable gate array device. In alternative embodiments, the programmable logic device 12 may be an application-specific integrated circuit, an application-specific standard part, a System-on-Chip, and the like. The system 30 may be used in any suitable application, such as a data center, network device, server, router, switch, gateway, firewall, bridge, hub, database, workstation, desktop computer, laptop computer, mobile device, wireless access point, wireless access device, and the like.

Interconnection resources 34 may be used to route signals, such as clock or data signals, through the programmable logic device 12. The programmable logic device 12 of FIG. 2, in one embodiment, may include a sectorized FPGA of the type described in U.S. Application No. 2016/0049941, "Programmable Circuit Having Multiple Sectors," which is incorporated by reference in its entirety for all purposes. As such programmable logic resources or blocks of the programmable logic device 12 may be distributed through a number of discrete programmable logic sectors or regions 32. Each programmable logic region 32 may include a number of programmable logic elements 36 having operations defined the design description(s) 14 stored in configuration memory 38 (e.g., configuration random access memory). The programmable logic elements 36 may include combinational or sequential logic circuitry. For example, the programmable logic elements 36 may include look-up tables, registers, multiplexers, routing wires, and so forth. A user may program the programmable logic elements 36 to perform a variety of desired functions. Operating the circuitry of the programmable logic device 12 causes power to be drawn from the power distribution network 42. The programmable logic device 12 may include transceiver circuitry 44 (e.g., high speed serial interface circuitry) for driving signals off of the programmable logic device 12 and for receiving signals from other devices.

There may be any suitable number of programmable logic regions 32 on the programmable logic device 12. Indeed, while 29 programmable logic regions 32 are shown in FIG. 2, it should be appreciated that more or fewer may appear in an actual implementation (e.g., in some cases, on the order of 50 to 100 regions or more). Each programmable logic region 32 may include a regional or sector control unit or circuit (RCU) 46 that controls the operation of the programmable logic sector 32. Each regional control circuit 46 may be in communication with a device control unit or circuit (DCU) 48. Each RCU 46 may accept commands and data from the DCU 48 and may read data from and write data into its configuration memory 38 based on control signals from the DCU 48. In addition to these operations, the RCU 46 may be augmented with numerous additional capabilities. For example, such capabilities may include locally sequencing reads and writes to implement error detection and correction on the configuration memory 38 and sequencing test control signals to effect various test modes.

The RCUs 46 and the DCU 48 may be implemented as logic circuits, such as state machines and/or processors. For example, each operation of the RCUs 46 or the DCU 48 may be implemented as a separate routine in a memory containing a control program. This control program memory may be fixed in a read-only memory (ROM) or stored in a writable memory, such as random access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic regions 32. This may provide usable extensibility in an efficient and easily understood way. This may be useful because new commands could bring about large amounts of local activity within the region at the expense of only a small amount of communication between the DCU 48 and the RCUs 46.

Each regional control circuit 46 thus may communicate with the DCU 48, which may coordinate the operations of the regional control circuits 46 and convey commands initiated from outside the programmable logic device 12. To support this communication, the interconnection resources 34 may act as a network between the DCU 48 and each regional control circuit 46. The interconnection resources 34 may support a wide variety of signals between the DCU 48 and each regional control circuit 46. In one example, these signals may be transmitted as communication packets.

The programmable logic device 12 may be electrically programmed. With electrical programming arrangements, the programmable elements 36 may include one or more logic elements (wires, gates, registers, etc.). For example, during programming, configuration data is loaded into the configuration memory 38 using pins and/or input/output circuitry (e.g., of the transceiver circuitry 44) of the programmable logic device 12. In one example, the configuration memory 38 may be implemented as configuration random-access-memory cells. The use of configuration memory 38 based on RAM technology is described herein is intended to be only one example. Moreover, configuration memory 38 may be distributed (e.g., as RAM cells) throughout the various programmable logic regions 32 of the programmable logic device 12. The configuration memory 38 may provide a corresponding control output signal that controls the state of an associated programmable logic element 36 or programmable component of the interconnection resources 34. The output signals of the configuration memory 38 may be applied to the gates of metal-oxide-semiconductor (MOS) transistors to control the states of the programmable logic elements 36 or programmable components of the interconnection resources 34.

Figure 3:
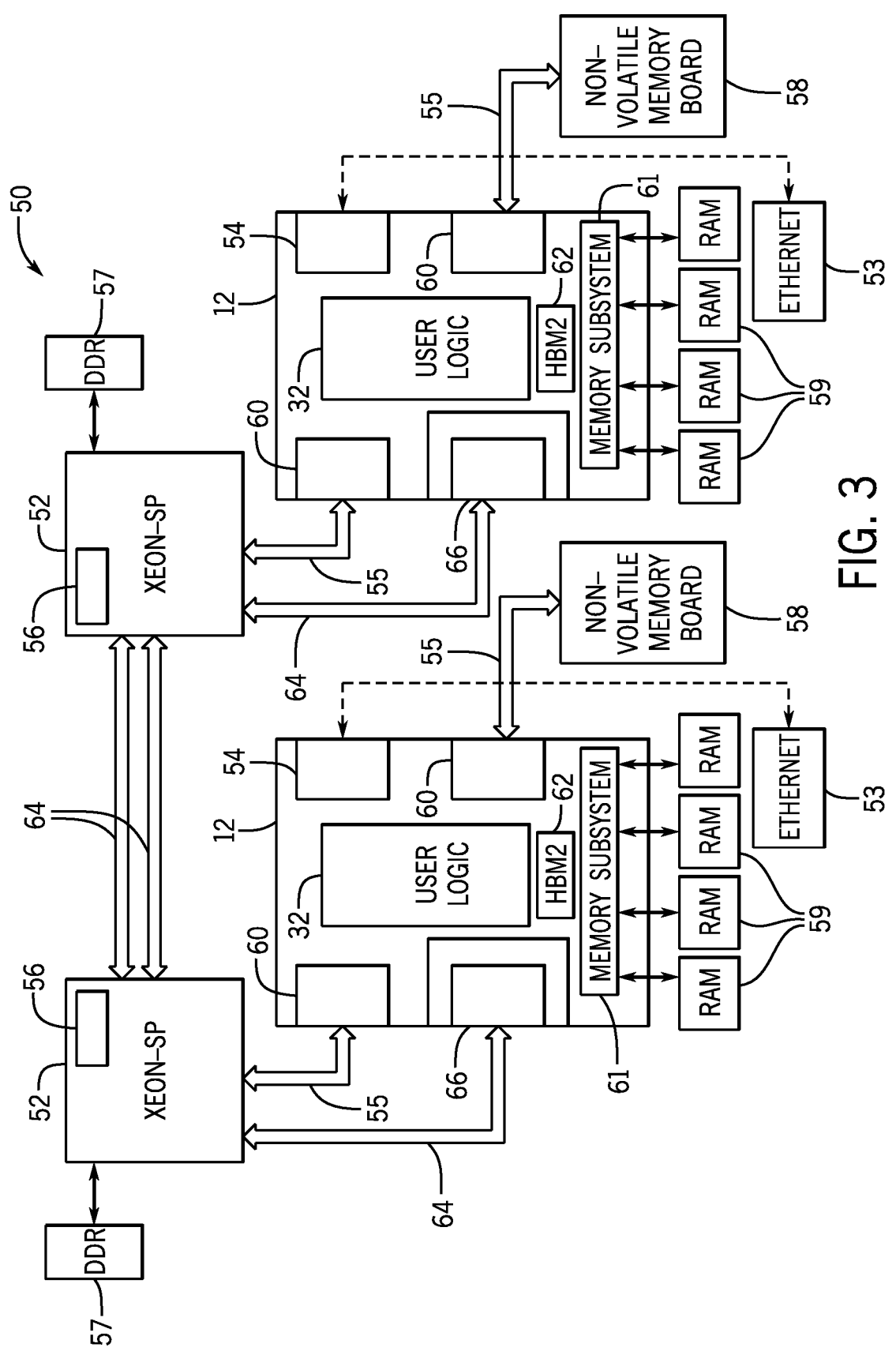
FIG. 3 is a data processing system, in accordance with an embodiment of the present disclosure.

In FIG. 3, a system 50 may include two programmable logic devices 12 that are configured to operate in coordination and connection with two processors 52. Additionally or alternatively, the system 50 may include any number of programmable logic devices 12 or processors 52. Regardless of numbers of the programmable logic devices 12 or processors 52, the system 50 may utilize in-line data routing and parallel data processing of programmable logic devices 12 and a sequential processing capability of processors 52 to enable flexible data processing using the system 50. The processors 52 may be any viable processor chip with appropriate processing means for specific design needs, such as INTEL's XEON® processors. The programmable logic device 12 may include an FPGA device with a programmable logic fabric for the specific design tasks specified by a designer. For example, the FPGA device may include as Intel's Stratix FPGA. Furthermore, processor 52 may perform various functions including, but not limited to, configuring the programmable logic device 12 by the way of similar operations to the computing system 10. The system 50 may perform coordinated data processing by employing one or multiple accelerators in the programmable logic device 12.

Data may be sourced at a network, a sensor, or other possible data sources, and the data may flow into the system 50 by the way of any viable means of data transportation, such as an Ethernet cable 53. The Ethernet cable 53 may be connected to a receiver subsystem 54 of the programmable logic device 12, and the data may be received at the receiver subsystem 54. The receiver subsystem 54, in some embodiments may be programmed onto one or multiple regional control circuitries 46 of the programmable logic device 12. Additionally or alternatively, the receiver subsystem 54 may be a pre-allocated subsystem of the programmable logic device 12. The receiver subsystem 54 may receive the data and prepare the received data for processing using other subsystems of the programmable logic device 12. Additionally or alternatively, the receiver subsystem may prepare the data for use by a partial reconfiguration profile of the programmable logic region(s) 32. Partial reconfiguration profiles may be defined as a bitstream program used to configure one or multiple programmable logic regions 32 that may be configured at runtime without changing configurations of other regions of the programmable logic device 12.

The received data may be processed in the programmable logic device 12 and/or passed onto the processor 52 for processing. Between the processor 52 and the programmable logic device 12, data may be transmitted and received by various interconnect methods or circuitry, by the way of example, a Peripheral Component Interconnect Express (PCIe) bus 55 may be used in the system 50. The PCIe bus 55 may also be used as the physical interface between the programmable logic device 12 and a non-volatile memory board 58 that includes one or more non-volatile memory blocks. The processed data may then be used as input for other processing tasks, transmitted to an external peripheral by the way of the Ethernet cable 53 or may be saved onto the memory blocks.

The non-volatile memory board 58 may be a flash memory, constituent of one or multiple memory blocks. The non-volatile memory board 58 may contain bitstream program(s), among other things, loaded onto the memory of the memory board 58 by the computing system 18 and may use the bitstream program(s) to program the programmable logic device 12 at each system power up or reset. The bitstream program(s) may contain instructions for data processing, data routing through the programmable logic device 12 and/or phase locked loop clock speed associated with the programmable logic device 12 as a whole or different segments of the programmable logic device 12.

The programmable logic device 12 may utilize a subsystem 60 to communicate with various peripherals. The subsystem 60 may perform data reception and transmission by encoding and decoding the data by the way of encryption of data according to rules associated with the protocol in use, onto the PCIe bus 55. The data reception and transmission subsystem 60 may be a subsystem of the programmable logic device 12 or a partial reconfiguration profile programmed onto programmable logic region(s) 32. The PCIe bus 55 may be a physical link between the peripherals shown in FIG. 3, but other viable data bus may be used in addition to or alternative to the PCIe bus 55.

The processor 52 may utilize a memory 57 and a cache memory for data processing. The cache memory may be embedded inside the processor 52 chip or may be embedded cache memory inside a separate chip connected communicatively to the processor 52. The Last Level Cache (LLC) memory 56 may be associated with the processor 52 in the system 50. The memory 57 may provide processor 52 with volatile memory storage availability for processing tasks. The memory 57 may or may not be existent in a final design based on system 50 functionality, requirements and design. The memory 57 may be of various memory forms and technologies such as, but not limited to, a double data rate synchronous dynamic random-access memory (DDR).

The programmable logic device 12 may perform processing of data by utilizing the RCUs 46 or DCUs 48 implemented on the programmable logic regions 32 and executed by the way of programmable logic elements 36. One or multiple programmable logic regions 32 of the programmable logic device 12 may be programmed to perform read and/or write instructions on one or multiple random access memories (RAM) 59. The RAM 59 may be accessed via the programmable logic device 12, by the way of utilizing a Memory Subsystem 61 and through input and/or output pins of the programmable logic device 12. The Memory Subsystem 61 may include a subsystem of the programmable logic device 12 or a partial reconfiguration profile configured in the programmable logic region of the programmable logic device 12. A high-bandwidth memory interface (HBM) 62 may also be utilized in some embodiments of the programmable logic device 12 that may use, as an example, 3-D stacked DRAM use or high-performance computing. The use of a HBM 62 may be merely an example and optional for a designer based on the memory access bandwidth required for data processing task, among other things.

Programmable logic device 12 may perform real-time and parallel data processing by programming multiple regional control units 46 onto the programmable logic regions 32 for accelerated processing of data. Data processing accelerators or accelerators may be implemented within the programmable logic device 12 (or another location) to provide an interface between the programmable logic device 12 and the respective memory blocks. That is, accelerators may perform some level of data processing after reading the data from the memory or before saving the received data inside the memory. This repeatable data manipulation may be loaded onto the programmable logic device 12 (or another location) to offload processing operations from the processors 52 to accelerate the storage/retrieval of data and/or other operations of the processors 52. An accelerator may be defined to perform data processing tasks such as, but not limited to, data encryption, data decryption, data compression, and data decompression. The accelerators may be defined on the programmable logic device 12 by the way of loading programs 24 from memory device(s) 20. The memory device(s) 20 may include the memory board 58 or the RAM 59. Furthermore, the programs 24 may include instructions for implementation of an accelerator or partial modification of definition of an implemented accelerator.

The processor 52 may perform sequential processing of data, which may use the LLC 56. The programmable logic device 12 may or may not employ a cache memory. Coherency in system memory enables a system function properly. Intel's proprietary coherent interconnect protocol, Intel Ultra Path Interconnect (UPI) 64 may be the coherent interconnect used for coherency between processors 52 and programmable logic devices 12 in the system 50. The UPI protocol 64 may employ various circuitry to create coherent interfaces between processing components of the circuit, such as the PCIe bus 55. The UPI protocol 64 may consist of a set of rules for exchanging packets of data between circuit components or devices. The use of UPI may be by the way of example and any other viable coherent interconnect may be used in the system 50 to impose the coherency between memories used by processors 52 and programmable logic devices 12.

The UPI protocol 64 may be a low-latency, point-to-point, coherent interconnect that enables scalable multiprocessor systems and, as discussed herein, may be used to integrate processors and programmable logic devices into a single system with extended coherency. The UPI protocol 64 may maintain a coherent interconnect by way of utilizing coherency elements of a protocol such as Caching agents (CA) and Home agents (HA). In multiprocessing systems with multiple processors maintaining local cached copies of shared memory locations, the caching and home agents may reflect local modifications of the shared memory on other memories to maintain coherent data across the system. The CAs may create read and write requests to the coherent memory, such as the LLC 56 in the respective processor 52. The CAs may also respond to other processor's UPI agents acquiring coherent data between the caching memories. The respective HAs may administer memory interactions from each respective processor's perspective. An HA may translate a physical memory address to a channel address (or the other way around) in coordination with a Memory Subsystem 61 associated with the communicative memory and a respective memory controller. The caching agent and a home agent in at least one of the processors 52 may be integrated as a caching and home agent. The caching and home agent may snoop inside the processors 52 and/or the programmable logic devices 12 to enable coherency in the system 50. The system 50 may implement cache coherency across through both distributed memory and integrated memory controllers.

UPI may enable modification of one or multiple configurations of one or more accelerators. The accelerators may be implemented in the programmable logic device 12, such as in the programmable logic regions 32. The accelerators may be used to offload repeatable tasks that may otherwise be performed by the processor 52 to reduce a load on the processors 52 potentially increasing processing and/or energy efficiency in the system 50.

Using the home and caching agents of the processors 52, the system 50 may extend into the programmable logic devices 12. The home and caching agents may be used to enable execution of dynamic modifications of the accelerators during runtime of the system 50. In other words, the UPI protocol agents may extend the access of UPI protocol 64 to the programmable logic regions 32 and consequently, the accelerators and memory blocks and/or controllers (e.g., Memory Subsystem 61) associated with the respective programmable logic devices 12. The extended UPI protocol 64 provides access to such constituents of the programmable logic device 12 to enable the processors 52 to perform processing and manipulation of data associated with the programmable logic devices 12, such as the RAM 59, coherently and in-line with rest of UPI connected memories of the system 50. The extended UPI protocol 64 may utilize a UPI stack 66 in the programmable logic devices 12. Each UPI stack 66 may be responsible for reliable data transmission and reception and data flow control over the UPI protocol 64 into the respective programmable logic device 12.

Figure 4:
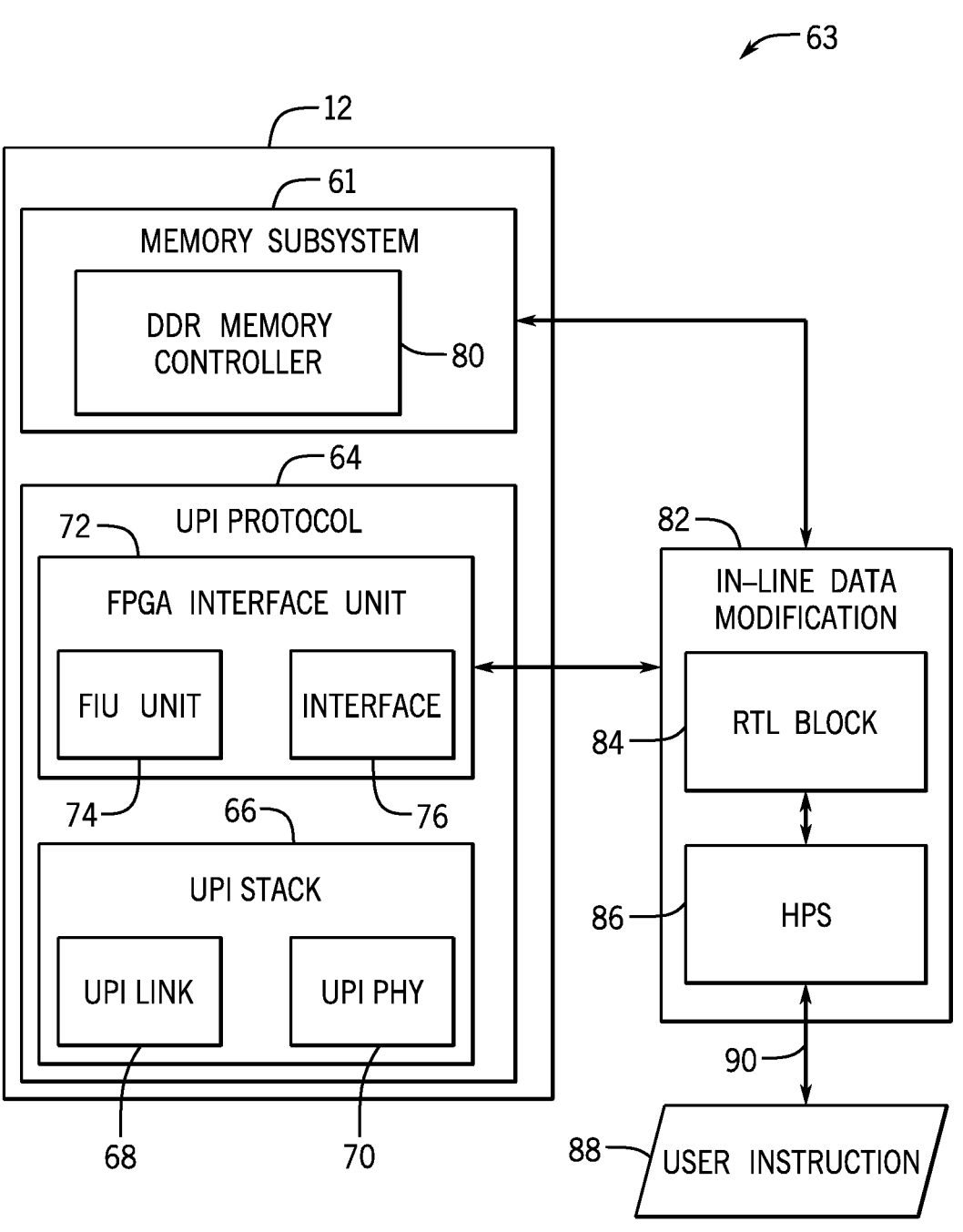
FIG. 4 is a functional block diagram of an accelerated data processing system, in accordance with an embodiment of the present disclosure.

FIG. 4 provides a functional block diagram of communication arrangement 63 between a respective processor 52 and a respective programmable logical device 12. The communication arrangement 63 include in-line processing of data by the programmable logic device 12 in communications between the processors 52 and programmable logic devices 12 of the system 50.

The communication arrangement 63 may use the UPI stack 66 and/or an FPGA Interface Unit (FIU) 72 to enable extended coherency across the system 50.

The UPI stack 66 may contain a UPI Link layer 68 and a UPI physical layer 70. The UPI Link layer 68 may enable reliable data transfer between two UPI protocol or routing entities. The UPI Link layer 68 may also control flow between the programmable logic device 12 and the processor 52. The UPI Link layer 68 may be used to prevent protocol deadlocks among other responsibilities. The UPI physical layer 70 wires carrying signals and/or circuitry/logic to support ancillary features used in the transmission and receipt of the data via the UPI protocol 64. The UPI physical layer 70 may take the form of PCIe bus 55 in some embodiments, as the base layer for UPI Link layer 68 functions. The UPI physical layer 70 and the UPI link layer 68 may provide the base for UPI agents to snoop through the system 50 to provide a coherent interconnection with processor 52.

The FIU 72 may include, among other things, an FIU sub-unit 74 that may enable data transmission between programmable logic device 12 and the processor 52 using an FIU-based protocol. As such, an FIU interface 76 may be used as an interface or bridge between FIU sub-unit 74 and the processor 52 for data transmission.

As illustrated, the programmable logic device 12 may be interconnected to a register transfer level (RTL) block 84 using the FIU 72 and/or the UPI stack 66. In some embodiments, the RTL block 84 may be embodied using a configuration loaded into the programmable logic region(s) 32 of the programmable logic device 12 from the programs 24. The RTL block 84 may be used to transmit and/or receive data to external units such as the processor 52 or the Memory Subsystem 61.

Moreover, the processor 52 may be integrated to the system 50 as a system-on-a-chip (SoC). In such embodiments, the processor 52 may be integrated as a Hard Processor System (HPS) 86. As discussed below, the HPS 86 may be used to control how the RTL block 84 is configured to control the in-line data modification performed by the RTL block 84. For example, the configuration of the RTL block 84 may be set to perform different parameters for tasks (e.g., encryption/decryption, compression/decompression, etc.) to accelerate operation of the system 50.

As illustrated, the Memory Subsystem 61 may include a memory controller 80, such as a dual data rate (DDR) memory controller. However, the memory controller 80 may include any suitable memory type. The memory controller 80 may enable the programmable logic device 12 (via the RTL block 84) to transmit or receive data to a corresponding memory (e.g., the RAM 59).

As previously noted, the UPI protocol 64 may enable the UPI protocol agents to access the memory subsystem 61 and memory controller 80. Indeed, the UPI protocol 64 may enable access to configuration of the RTL block 84. Furthermore, the memory controller 80 may provide snooping capabilities to the protocol agents by establishing a connection between physical memory addresses and the protocol agents. The aforementioned techniques may enable coherent access to memory blocks coupled to the programmable logic device 12. That is, memory blocks coupled to the programmable logic device 12, may be accessible and modifiable by the coherently interconnected processor(s) 52. Thus, such memory (e.g., RAM 59) coupled to the programmable logic device 12 may be made available to all the processors 52 as coherent system memory.

In some embodiments, the HPS 86 may provide instructions 88 to the programmable logic device 12 to modify the RTL block 84. The HPS 86 may utilize the instructions 88 t changing the configuration of the accelerator between multiple accelerator settings by modifying the programming and/or loading alternative programming of the accelerator into the programmable logic region(s) 32.

The HPS 86 may receive a modification instructions 88 to utilize or modify an accelerator implemented in an RTL block 84. The user may provide the instructions 88, to the processor or HPS 86 through an application program interface (API). The API may provide the user with an interface. The API may receive instructions using a high-level programming language such as, C programming language and other high-level programming languages. The HPS 86 may utilize to translate the user provided instructions to a low-level programming language, such as a Hardware Description Language, that may be used by the logic programming language 12 to implement changes to the RTL block 84. For example, the HPS 86 may implement a compiler to perform such translations. Thus, using the UPI protocol 64 and the dynamic programming using the HPS 86, the system 50 may provide dynamic programming of the programmable logic device 12 during system runtime, which may increase the flexibility of the system.

The extended UPI protocol access, described above, may expose the programmable logic device 12 and the respective constituent blocks to a user. That is, a user may partially modify or reconfigure the programmable logic device 12 by providing instructions to HPS 86 using a high-level programming language. The aforementioned approach may enable partial reconfiguration or modification of the programmable logic device 12 by the system 18 dynamically during system runtime. The user instructions 88 may modify the processing technique used in RTL block 84 for storing the data, handling the data or transmitting the data to the Memory Subsystem 61, among other things. The extended UPI protocol access may also increase the design flexibility of the system 50 by allowing partial modification or reconfiguration of the programmable logic region(s) 32 by the way of the instructions 88 through the API 90.

In certain embodiments, the user instructions 88 may be directed to enable the RTL block 84 to perform a task as an accelerator. The instructions may be computer-readable instructions readable by the HPS 86. The user instructions 88 may be directed toward configuring the RTL block 84 to encrypt data using particular technique. Data encryption may be performed by the way of accelerators and more than one accelerator may be available for different levels of data encryption. The various configurations for data encryption may reside inside the memory in the form of bitstream data to be chosen by user instructions to be implemented in the RTL block 84. The various encryption accelerators may also be pre-implemented onto the RTL block 84, and the user instructions may modify the portion of the programmable logic region(s) 32 for the chosen level of data encryption. The data encryption configuration(s) may include various levels of power consumption for encryption, loss-less encryption, or lossy encryption of data or other classifications of encryption techniques.

Figure 5:
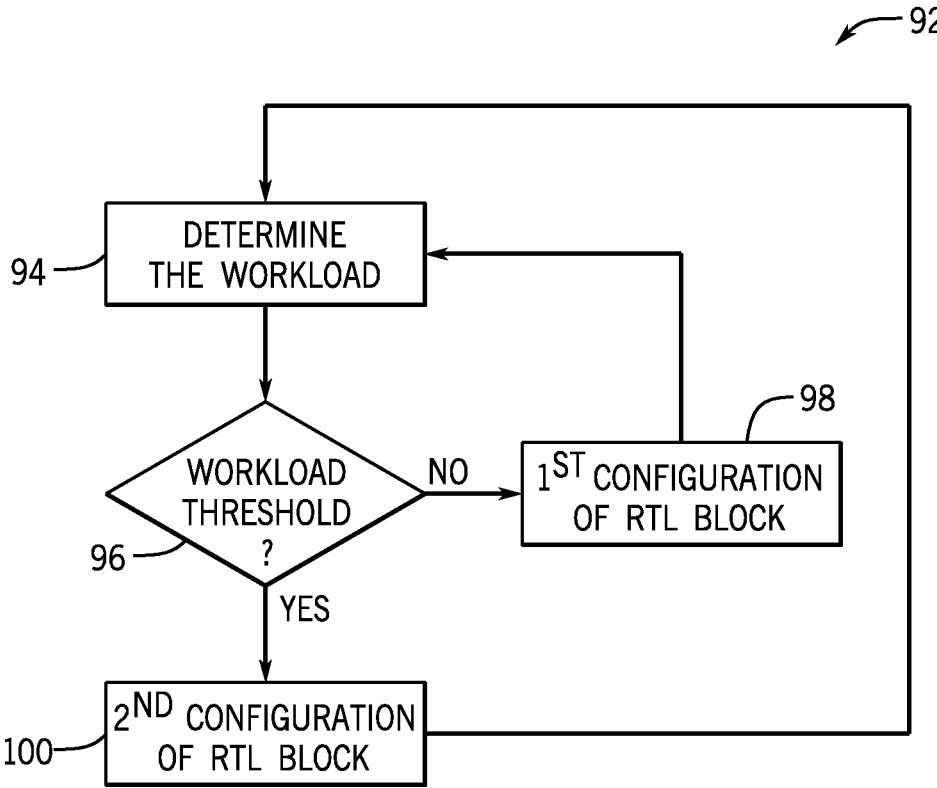
FIG. 5 is a processing flow chart of a processor, in accordance with an embodiment of the present disclosure.

Additionally or alternatively, the user instructions 88 may be directed toward an accelerator to perform a decryption of data. Data decryption may be performed using the RTL block 84. More than one accelerator configuration may be available for different levels of data decryption. The various accelerators for data decryption may reside inside the memory in the form of bitstream data to be chosen by the way of user instructions to be implemented in the RTL block 84. The various decryption accelerators may also be pre-implemented in the RTL block 84 or may be reconfigured at runtime. The data encryption configuration(s) may include various levels of power consumption for decryption, lossless decryption, or lossy decryption of data or other classifications of decryption techniques. In addition to or alternative to encryption and decryption, the RTL blocks 84 may be configured to different levels of compression/decompression. For example, a first level of compression/decompression may be used when a workload is low, but a second level of compression/decompression may be used when a workload is high. Other configurations may also be used for the RTL blocks 84 other than different levels of encryption/decryption or compression/decompression FIG. 5 may describe a process 92 implemented by the processor 52. The processor 52 of the system 50 may utilize the UPI protocol 64 to access and/or make modifications to the configurations of the programmable logic device 12 for the RTL block 84. The modifications may include making a decision to utilize a certain configuration for the RTL block 84 based on workload for the system 50. The processor 52 may start with determining the workload for the system 50, the processor 52, and/or the programmable logic device 12 (block 94). The workload may be defined by determining the amount of data to be processed, number of flip-flops in use in the programmable logic device 12, amount of heat generated, latency of processing, or any other suitable parameters for measuring a workload for the system 50, the processor 52, and/or the programmable logic device 12 among other things.

The processor 52 may compare the determined workload to one or multiple previously defined thresholds (block 96). When the workload is below a threshold, a first configuration is loaded into the RTL block 84 (block 98). When the workload is not below a threshold, a second configuration is loaded into the RTL block 84 (block 100). The first configuration may be a first level of encryption/decryption or compression/decompression. The second configuration may be a second level of encryption/decryption or compression/decompression that consumes less processing resources than the first configuration. Although the illustrated embodiment of the process 92 includes a single threshold, other embodiments may employ multiple thresholds to compare against the determined workload with more than two configurations. For example, there may be one more configurations than thresholds.

Figure 6:
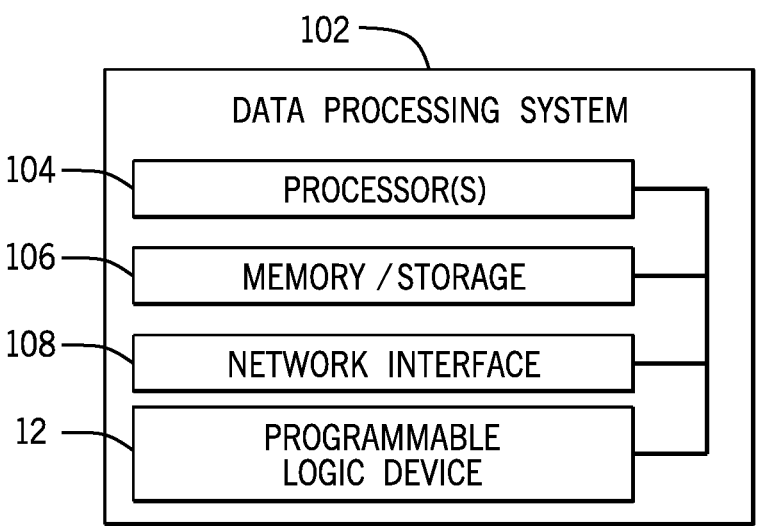
FIG. 6 is a data processing system, in accordance with respective embodiments of the present disclosure.

The programmable logic device 12 may be a data processing system (e.g., system 50) or may be a component of a data processing system. For example, the programmable logic device 12 may be a component of a data processing system 102, shown in FIG. 6. The data processing system 102 includes a processor 104 (e.g., processor 52), memory and/or storage circuitry 106 (e.g., RAM 59), and a network interface 108 and may present viable embodiments that may be associated with the system 50. The data processing system 102 may include more or fewer components (e.g., electronic display, user interface structures, application specific integrated circuits (ASICs)). The processor 104 may include any suitable processor, such as an INTEL® XEON® processor or a reduced-instruction processor (e.g., a reduced instruction set computer (RISC), an Advanced RISC Machine (ARM) processor) that may manage a data processing request for the data processing system 102 (e.g., to perform machine learning, video processing, voice recognition, image recognition, data compression, database search ranking, bioinformatics, network security pattern identification, spatial navigation, or the like). The memory and/or storage circuitry 106 may include random access memory (RAM), read-only memory (ROM), one or more hard drives, flash memory, or the like. The memory and/or storage circuitry 106 may be considered external memory to the programmable logic device 12 and may hold data to be processed by the data processing system 102. In some cases, the memory and/or storage circuitry 106 may also store configuration programs (e.g., bitstream) for programming the programmable logic device 12. The network interface 108 may enable the data processing system 102 to communicate with other electronic devices. The data processing system 102 may include several different packages or may be contained within a single package on a single package substrate.

In one example, the data processing system 102 may be part of a data center that processes a variety of different requests. For instance, the data processing system 102 may receive a data processing request via the network interface 108 to perform machine learning, video processing, voice recognition, image recognition, data compression, database search ranking, bioinformatics, network security pattern identification, spatial navigation, or some other specialized task. The processor 104 may cause the programmable logic fabric of the programmable logic device 12 to be programmed with a particular accelerator related to requested task. For instance, the processor 104 may instruct that configuration data (bitstream) stored on the memory/storage circuitry 106 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 102 in performing the requested task. Indeed, in at least one example, an accelerator may assist with a voice recognition task less than a few milliseconds (e.g., on the order of microseconds) by rapidly accessing and processing large amounts of data in the accelerator using sector-aligned memory.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A computing system, comprising:
memory configured to store data;
a programmable logic fabric coupled to the memory, wherein the programmable logic fabric is to implement an accelerator, wherein the memory is external to the programmable logic fabric; and
a processor coupled to the programmable logic fabric, wherein the processor is external to the programmable logic fabric that makes the memory available to the processor, and is configured to process and manipulate the stored data in the memory by accessing the memory based on snooping through the accelerator using coherency agents of a first protocol, wherein the coherency agents are configured to snoop inside the processor and the accelerator and enable the processor to modify a definition of the accelerator and snoop the memory using communications through the programmable logic fabric to provide a coherent interconnection between the memory and the processor through the programmable logic fabric, wherein the coherency agents of the first protocol are configured to snoop inside the programmable logic fabric via second coherency agents of a second protocol, wherein the second coherency agents of the second protocol are configured to coherently interconnect a second memory to the processor, and the processor is configured to modify the accelerator dynamically during a runtime of the computing system based at least in part on the coherency agents being configured to snoop inside the processor and the accelerator.

2. The computing system of claim 1, wherein the processor is configured to access the memory based on receiving instructions of a high-level programming language.

3. The computing system of claim 1, wherein the accelerator is defined using a Hardware Description Language (HDL).

4. The computing system of claim 1, wherein the accelerator is programmed using a Register Transfer Level description.

5. The computing system of claim 1, wherein the processor is configured to convert high-level programming language to a Hardware Description Language (HDL) using a compiler.

6. The computing system of claim 1, wherein the processor is configured to modify the definition of the accelerator to perform data encryption or data decryption based at least in part on the coherency agents being configured to snoop inside the processor and the accelerator.

7. The computing system of claim 6, wherein the accelerator comprises a plurality of selectable operation instructions defined for data encryption, wherein the processor is configured to select a selectable operation instruction of the plurality of selectable operation instructions to modify the definition of the accelerator.

8. The computing system of claim 6, wherein the accelerator comprises a plurality of selectable operation instructions defined for data decryption, wherein the processor is configured to select a selectable operation instruction of the plurality of selectable operation instructions to modify the definition of the accelerator.

9. The computing system of claim 1, wherein the processor is configured to modify the definition of the accelerator to perform data compression or data decompression based at least in part on the coherency agents being configured to snoop inside the processor and the accelerator.

10. The computing system of claim 9, wherein the accelerator comprises a plurality of selectable operation instructions defined for data compression, wherein the processor is configured to select a selectable operation instruction of the plurality of selectable operation instructions to modify the definition of the accelerator.

11. The computing system of claim 9, wherein the accelerator comprises a plurality of selectable operation instructions defined for data decompression, wherein the processor is configured to select a selectable operation instruction of the plurality of selectable operation instructions to modify the definition of the accelerator.

12. The computing system of claim 1, wherein the coherency agents comprise caching agents, home agents, or both.

13. The computing system of claim 1, wherein the processor is configured to coherently read from and write to the memory via the accelerator using the coherency agents.

14. A memory coherent system, comprising:
a first memory configured to store data;
a programmable logic device coupled to the first memory, wherein the programmable logic device is configured to implement an accelerator to modify the data being stored to the first memory, wherein the accelerator is defined using a hardware description language, wherein the first memory is external to the programmable logic device; and
a processor comprising a second memory, wherein the processor is external to the programmable logic device, and wherein the processor is configured to couple to the programmable logic device that provides access to the first memory for the processor, to process and manipulate the stored data in the first memory by accessing the first memory based on snooping through the accelerator, and to access the first memory and the second memory using coherency agents of a first protocol, wherein the coherency agents are configured to snoop inside the processor and the accelerator and enable the processor to and snoop the first memory using communications through the programmable logic device to provide a coherent interconnection between the first memory and the processor through the programmable logic device, wherein the coherency agents of the first protocol are configured to snoop inside the programmable logic device via second coherency agents of a second protocol, wherein the second coherency agents of the second protocol are configured to coherently interconnect the second memory to the processor, and the processor is configured to modify the accelerator dynamically during a runtime of the memory coherent system based at least in part on the coherency agents being configured to snoop inside the processor and the accelerator.

15. The memory coherent system of claim 14, wherein the processor is configured to access the first memory based on receiving instructions of a high-level programming language.

16. The memory coherent system of claim 14, wherein the definition of the accelerator is stored in the first memory and the processor is configured to modify the definition of the accelerator by accessing the first memory based at least in part on the coherency agents being configured to snoop inside the processor and the accelerator.

17. The memory coherent system of claim 14, wherein the processor is configured to apply a partial reconfiguration to the accelerator during runtime using a coherent interconnection protocol.

18. The memory coherent system of claim 14, wherein the coherency agents comprise caching agents, home agents, or both.

19. The memory coherent system of claim 14, wherein the first memory comprises a random access memory and the second memory comprises a cache disposed inside the processor.

\* \* \* \* \*